United States Patent [19]
Del Signore

[11] Patent Number: 5,935,199
[45] Date of Patent: Aug. 10, 1999

[54] DC ACCURATE MULTI-RATE DIGITAL FILTER WITH COMMON COEFFICIENT SET AND DC GAIN CORRECTION

[75] Inventor: Bruce P. Del Signore, Hollis, N.H.

[73] Assignee: Cirrus Logic, Inc., Fremont, Calif.

[21] Appl. No.: 08/883,952

[22] Filed: Jun. 27, 1997

[51] Int. Cl.⁶ .......................... G06F 17/17; G06F 17/10
[52] U.S. Cl. .......................................... 708/313; 708/303
[58] Field of Search .......................... 364/724.1, 724.013

[56] References Cited

U.S. PATENT DOCUMENTS

| | | |
|---|---|---|
| 4,775,851 | 10/1988 | Borth . |
| 4,783,660 | 11/1988 | Pierce ................................. 364/724.12 |
| 4,791,597 | 12/1988 | Miron et al. . |
| 5,157,395 | 10/1992 | Del Signore et al. . |
| 5,257,026 | 10/1993 | Thompson et al. .................. 364/724.1 |
| 5,506,798 | 4/1996 | Shimada et al. ..................... 364/724.1 |
| 5,696,708 | 12/1997 | Leung . |

OTHER PUBLICATIONS

"A Unity Bit Coding Method by Negative Feedback", H. Inose and Y. Yasuda, *Proceedings of the IEEE*, vol. 51, pp. 1524–1535, Nov. 1963.

"A Novel Higher Order Interpolative Modulator Topology for High Resolution Oversampling A to D Converters", W. Lee, Massachusette Institute of Technology MSEE Thesis, Jun. 1987.

"Nine Digital Filters for Decimation and Interpolation", D. Goodman and M. Carey, *IEEE Transactions on Acoustics, Speech, and Signal Processing*, vol. ASSP–25, No. 2, Apr. 1977.

*Primary Examiner*—Tan V. Mai
*Attorney, Agent, or Firm*—McDermott, Will & Emery

[57] ABSTRACT

A system and method for providing a dc accurate multi-rate digital filter with common coefficient set and dc gain correction utilizes at least one common coefficient set and at least one dc gain correction factor to provide a variable, dc accurate and corrected, multi-rate, digital filter using dc gain corrected subsets of the one stored common coefficient set. The filter maintains at least one common digital filter coefficient set which includes a number of coefficient values.

16 Claims, 6 Drawing Sheets

DC ACCURATE MULTI-RATE DIGITAL FILTER WITH COMMON COEFFICIENT SET AND DC GAIN CORRECTION

FIELD OF THE INVENTION

This invention relates to digital filters and in particular, to a digital filter which uses a common set of coefficients to create dc accurate multiple digital filters each of which utilize a subset of the original set of coefficients to provide a variable decimation digital filter.

BACKGROUND OF THE INVENTION

Digital filtering and in particular, digital processing of analog signals (A/D conversion) is now well known. The processing of analog signals can be done much more efficiently with digital methods than with analog methods. Better signal-to-distortion and signal-to-noise ratios, faster design cycles, and lower product cost are some benefits of A/D conversion.

Any form or method of A/D conversion consists of at least two operations. The first operation is sampling and the second is signal quantization.

Sampling consists of taking samples of the analog signal at regular intervals while quantization involves assigning a digital value to the sampled analog signal. During quantization, it is desirable to limit the number of different values that the samples can assume so that each sample can be expressed as a digital word with a finite number of bits.

Various analog sampling and conversion to a digital bit stream methods have been developed. One popular method, commonly referred to as the Delta-Sigma method (sometimes also referred to as Sigma-Delta), was developed in the 1960's in an attempt to provide highly accurate low frequency A/D converters. See for example, "A Unity Bit Coding Method by Negative Feedback", by H. Inose and Y. Yasuda, Proceedings of the IEEE, November 1963.

Utilizing the Delta-Sigma method, an effective and efficient filter can be provided using digital filter circuits which incorporate one or more digital multipliers and digital adders. Although the digital multipliers and digital adders contribute to the effectiveness of a digital filter, adders, and especially multipliers also contribute to the large size and power consumption of such digital filter circuits.

Additionally, it is often desired to provide an A/D converter in which the filter rate can be adjusted to suit the needs of the application or which can be dynamically adjusted, as desired, in real time. Such filters typically require either multiple digital filter stages designed and laid out on the same semiconductor chip, or a single digital filter stage incorporating a multiplier and adder which can be utilized for each "stage" of filtering by utilizing stored filter coefficients. Each "set" of filter coefficients is designed to provide a specific decimation rate and filter transfer function.

Some prior art attempts have been made at providing a multiplierless digital filter. Multipliers in a single bit digital Delta-Sigma filter can be eliminated if all the filtering is performed in one stage (the multiplicand is 1 or 0 and therefore the operation is really an addition). Such single stage multiplierless filters, however, cannot perform variable decimation filtering without storing separate coefficients for each filter in ROM.

When implementing a multi-stage filter with several coefficient sets, the length of the filter and the size of the ROM required to store the coefficient sets can become quite large, although not as large as the size of a multiplier. For example, for an 8 (eight) stage single bit filter, approximately 200,000 (200K) bits of ROM are required. Most importantly, however, filter efficiency including filter rate, power dissipation and frequency response is greatly affected when the filter circuit length is increased and when the filter must continuously access ROM to retrieve different coefficient sets.

Although complicated and highly efficient filters are desirable, modern technology is driving the size and power consumption of integrated circuits to their limits and dictating that highly efficient dc accurate multi-rate or variable decimation digital filters must be provided in considerably less size or area on the silicon, and with greatly reduced power consumption.

SUMMARY OF THE INVENTION

In accordance with the invention, a dc accurate multi-rate, digital filter with common coefficient set and dc gain correction processor, for receiving a 1-bit digital signal which is derived from a sampled analog signal, and for outputting a decimated and dc gain corrected multi-bit digital signal. The dc accurate multi-rate digital filter of the present invention includes a decimation controller, responsive to at least one decimation rate input signal, for providing at least one common coefficient set address control signal and at least one coefficient processor control signal.

Several embodiments of the invention are shown including implementations with computer systems including hardware and software, as well as embodiments in semiconductor chips.

DETAILED DESCRIPTION OF THE PREFERRED EMBODIMENT

Figure 1:
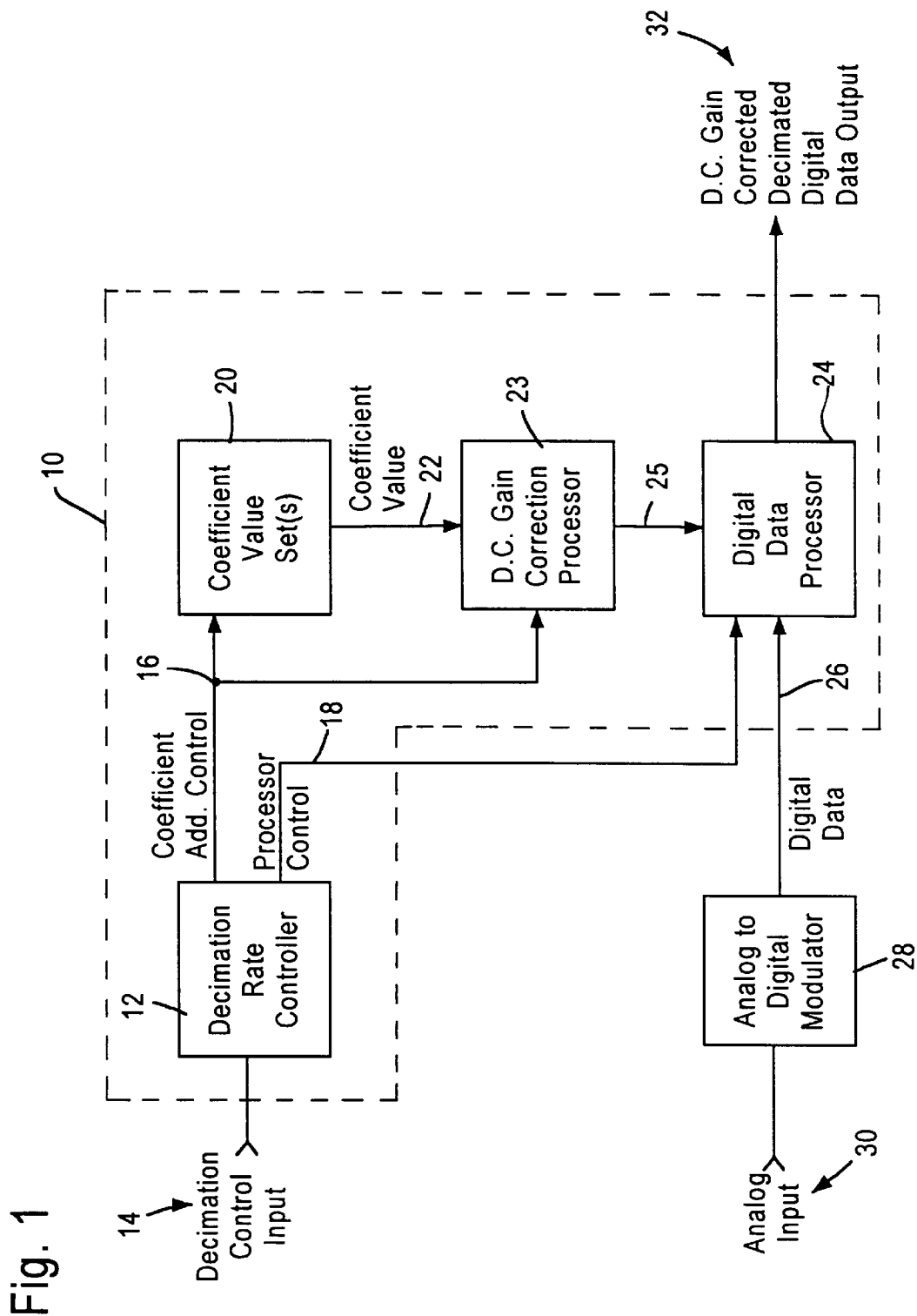
FIG. 1 is a schematic block diagram of the dc accurate multi-rate digital filter with common coefficient set according to the present invention.

Referring to FIG. 1, a dc gain corrected multi-rate or variable decimation rate digital filter 10 is shown with common coefficient set 20, which is able to provide a number of filters. Each filter has a bandwidth which is a multiple of the bandwidth of the base or common filter coefficient set and each filter has a dc accurate gain. The number of filters is limited only by the number of coefficients in the common set. The maximum number of filters possible can be represented by the value of $[\log_2(n)]+1$, rounded to the nearest integer, where n is the number of coefficients in the first coefficient set. The dc gain of each filter can be corrected by a dc gain correction processor circuit which eliminates any errors in dc gain caused by the generation of filter subsets. It should also be noted that more than one "common" set of coefficients can be provided to generate subsets of itself, in order to save a multiplier, if subsets are not "binary" subsets. Additionally, although the present invention is preferably implemented on and within an integrated circuit multi-rate, digital filter with common coefficient set and dc gain correction for use in thermocouple transducers. The present has numerous applications such as sound processing applications utilizing computer hardware and/or software.

The multi-rate, digital filter 10 with common coefficient set and dc gain correction values 20, according to the present invention, includes decimation rate controller 12 which preferably receives, as input, decimation control input signal 14 which may be a single digital bit or a string of bits. Responsive to decimation control input signal 14, decimation controller 12 generates coefficient address control or filter selection signal 16 and digital data processor control signal 18.

One or more common coefficient value set(s) 20 are preferably stored in individually addressable storage elements such as semi-permanent, semiconductor memory including read only memory (ROM) or other similar storage devices or elements. Each of the values in coefficient set 20 are individually addressable and are provided to dc gain correction processor 23.

DC gain correction processor 23, synchronized by a system clock, as will be explained further below, receives as input an addressed coefficient value 22. Responsive to addressed coefficient value 22 and coefficient address or filter selection control signal 16, dc gain correction processor 23 provides a dc gain corrected coefficient value 25 to digital data processor 24.

Multi-rate digital filter 10 also receives as input digital data stream 26, preferably a one bit digital data stream, from analog-to-digital sampler or modulator 28, such as a Delta-Sigma modulator, or other conventional analog to digital conversion devices or modulators. Digital data stream 26 may alternatively comprise multi-bit digital data streams. Analog to digital modulator 28 receives as input an analog input signal 30, which is to be converted to a digital value.

DC gain correction processor 23 receives as input individual addressed coefficient values 22 provided from coefficient value set 20, and a coefficient address selection and control signal 16 to provide dc gain corrected coefficient values 25. Digital data processor 24 receives as input dc gain corrected coefficient values 25 and digital data stream 26 to provide N-bit dc gain corrected decimated digital data output 32 for use by other digital data processing and display devices.

Figure 2:
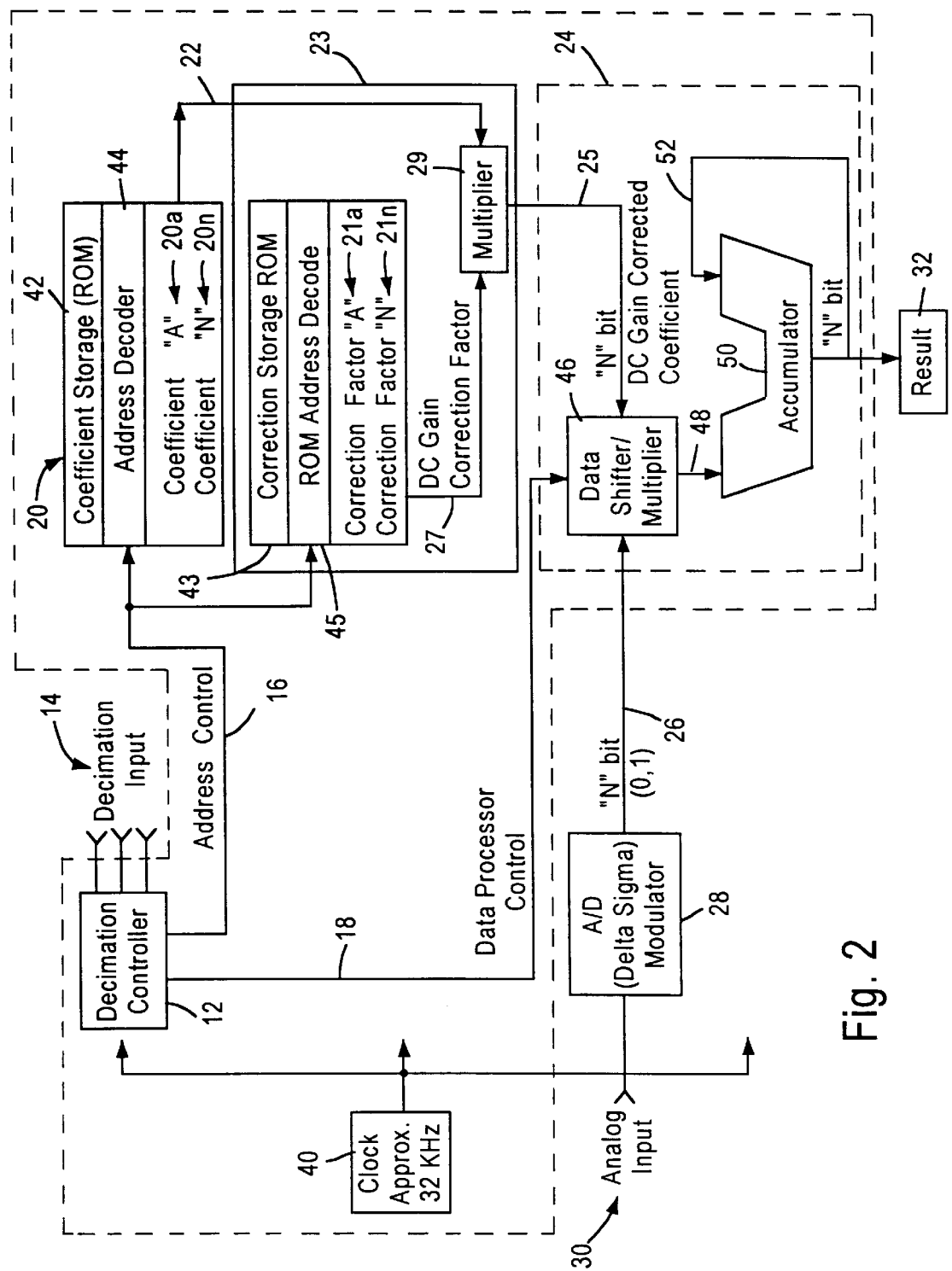
FIG. 2 is a more detailed schematic block diagram of preferred embodiment of the dc accurate multi-rate digital filter with common coefficient set of the present invention.

As shown in greater detail in FIG. 2 the dc accurate multi-rate digital filter with common coefficient set and dc gain correction processor 10, according to the present invention, receives a decimation control input signal 14 which, in the preferred embodiment, includes three inputs coupled to three input "pins" on an integrated circuit on which the digital filter of the present invention is implemented. Using three inputs, up to eight different digital filters may be provided. Each filter is selected by the user before A/D conversion begins. Decimation controller 12 is an address decoder or similar device as is well known in the art.

Decimation controller 12, synchronized in conjunction with other elements of the dc accurate multi-rate digital filter 10 utilizing a common system clock 40 operating at approximately 32 kHz, in the preferred embodiment, provides a coefficient address (or filter "selection") control signal 16 and a digital data processor control signal 18. A coefficient set storage element or device such as a read only memory (ROM) 42 stores one or more sets of coefficients 20 including a plurality of individually addressable coefficient set values 20a, 20n.

A ROM address decoder 44, as is well known in the art, is responsive to address signal(s) 16, to address and select individually addressable coefficient values 20a, 20n, under control of decimation controller 12. When addressing the highest decimation filter coefficient set, decimation controller 12 sequentially addresses each and every coefficient value in first or common coefficient set 20. When implementing other decimation filters whose coefficients are subsets of the base or common coefficient set, decimation controller 12 selectively provides a coefficient value address decode signal 16 which selects predetermined periodic values from the base or common coefficient set 20 as will be explained in greater detail below. The "N" bit coefficient value 22 is provided to the dc gain correction processor 23.

Depending on the decimation filter selected, the coefficient address control and decoding signal 16 is used to select one of the dc gain correction factors 21a, 21n stored in dc gain correction factor storage element 43, such as a Read Only Memory (ROM). An address decoder 45, such as a conventional ROM address decoder, [as is well known in the art], is responsive to address control and decoding signal 16 to select one of the individually addressable dc gain correction factors 21a, 21n, and to provide a selected dc gain correction factor value 27.

The "N" bit coefficient value 22 is then multiplied by the selected dc gain correction factor value 27 in the multiplier 29, and the resultant "N" bit corrected coefficient value 25 is output and provided to the digital data processor 24.

Analog signal 30, which is processed by analog-to-digital modulator 28, such as a Delta-Sigma or other similar sampling device utilizing an appropriate technique, provides an N-bit digital data stream 26 to the data shifter/multiplier 46. In the preferred embodiment, the N-bit digital data stream 26 is a I (one) bit data stream, although this is not a limitation of the present invention. Shifter/multiplier 46, such as a shift register or other conventional multiplier circuit or device, under control of data shifter/multiplier control signal 18 from decimation controller 12, multiplies the "N" bit corrected coefficient value 25 by one bit digital data 26.

The "multiplication" of an "N" bit corrected coefficient value 25 and a one bit digital data value 26 is in reality an addition, since the multiplicand (the one bit digital data 26) is either a one (1) or a zero (0). The "multiplication" can thus be achieved without a true "multiplier" and therefore, a considerable amount of area or "real estate" can be saved in the case wherein the present invention is implemented on an integrated circuit.

When implementing the present digital filter 10 which utilizes the highest decimation for which the coefficient values are stored in coefficient storage element 42, the dc gain correction factor 21a has a value of one (1), since the coefficient set values 20 stored in coefficient storage element 42 are the dc gain corrected coefficient values for the highest decimation filter. When a digital filter stage is implemented which uses a subset of coefficient set value 20 stored in coefficient storage element 42, dc gain correction processor multiplier 29 performs the requisite multiplication of the coefficient value 22 by the selected dc gain correction factor 27, to provide the proper dc gain correction to the selected coefficient values of set 20. If the bandwidth of a second or subsequent digital filter is a binary subset of the first filter which is implemented utilizing the common coefficient set 20, dc gain correction factor 27 is a power of two (2), and the multiplier 29 can be implemented with a simple binary shifter instead of a true digital multiplier, thus saving considerable circuitry.

If the second or subsequent filter stage is not a binary multiple of the base or highest decimation rate filter stage, a true "multiplier" device or effect must be provided as the multiplier 29, as is well known in the art. The resulting dc gain "corrected" coefficient value 25 can then be "multiplied" by the 1-bit digital data in the data shifter/multiplier 46.

The result 48 from the data shifter/multiplier 46 is provided to accumulator 50 which "adds" the result 48 from the data shifter/multiplier 46 with the previously stored result 52, and upon completion of the "multiplication" of all the coefficient values in the current filter being used, provides a decimated digital data output result 32.

Figures 3, 4:
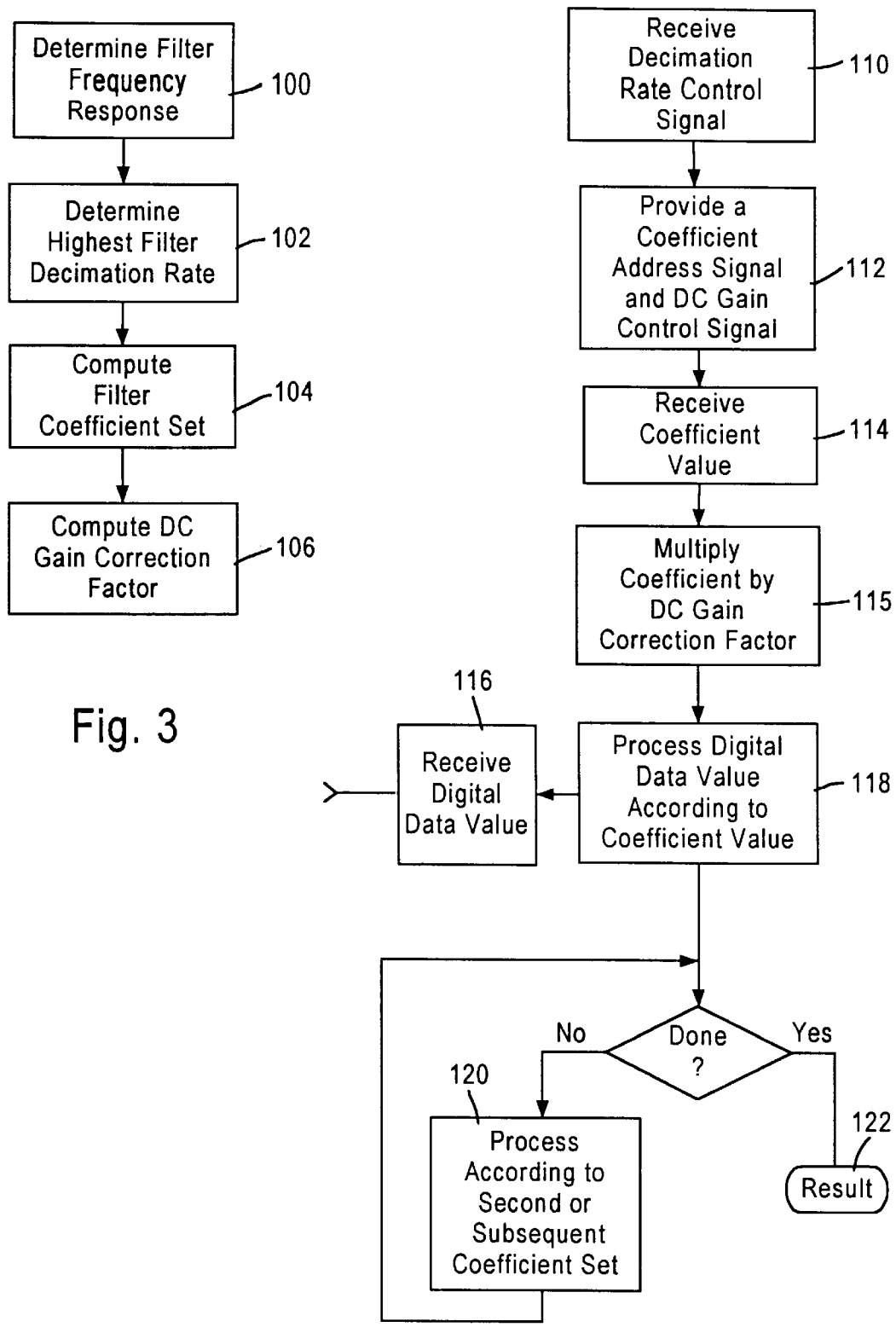
FIG. 3 is a flow chart illustrating the steps in establishing the common coefficient set and dc gain corrective factor of the dc accurate multi-rate digital filter of the present invention.
FIG. 4 is a flow chart of the steps for processing a digital signal by the dc accurate multi-rate digital filter with common coefficient set and dc gain correction processor of the present invention.

In order to provide a dc accurate multi-rate digital filter with common coefficient set 10 in accordance with the present invention, several steps must first take place. Initially, the desired frequency response characteristics of the filter must be determined, step 100, FIG. 3. Next, the filter with the highest decimation must be calculated, step 102.

Utilizing one or more well known algorithms, such as the Parks-McLellan algorithm, the requisite filter coefficients which form a coefficient set are designed or computed, step 104. The dc gain correction factor is then computed, step 106.

Figure 5:
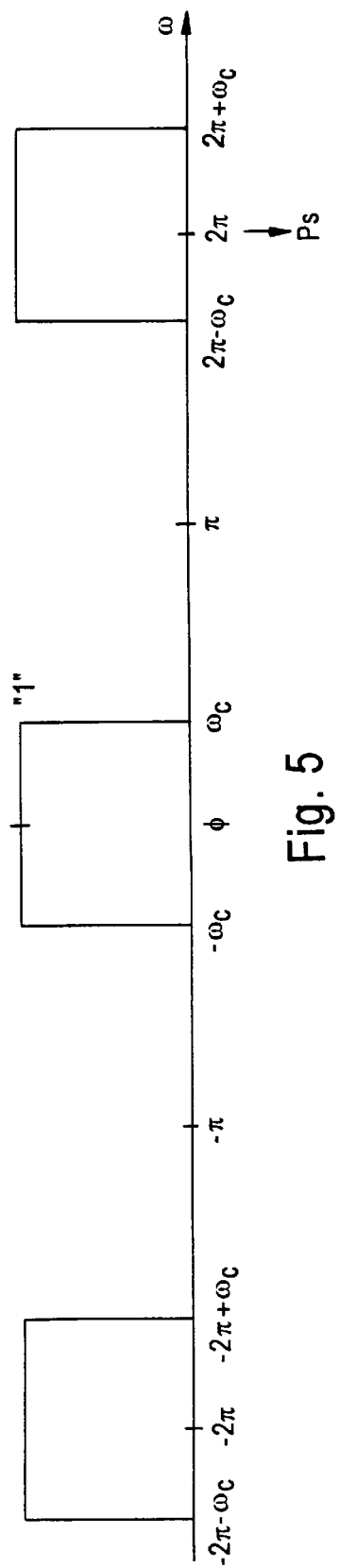
FIG. 5 is a graph of an exemplary ideal digital filter frequency response characteristics to be achieved utilizing the digital filter of the present invention.

For illustrative purposes, assume it is desired to design a filter with the frequency characteristics shown in FIG. 5, wherein:

$$H(e^{j\omega}) = 1 : -\omega_c \langle \omega \langle \omega_c \quad \text{Equation 1}$$
$$H(e^{j\omega}) 0 : \omega_c \langle \omega \langle \pi$$

The synthesis equation of the Discrete Time Fourier Transform (DTFT) allows a frequency domain to time domain transform of:

$$h(n) = \frac{1}{2\pi} \int_{-\pi}^{\pi} H(e^{j\omega}) e^{j\omega n} d\omega \quad \text{Equation 2}$$
$$= \frac{1}{2\pi} \int_{-\omega_c}^{\omega_c} e^{j\omega n} d\omega$$
$$= \frac{1}{2\pi} \frac{1}{jn} (e^{j\omega n} 1_{-\omega_c}^{\omega_c})$$
$$= \frac{1}{2\pi jn} (e^{j\omega_c n} - e^{-j\omega_c n})$$

$$= \frac{1}{2\pi jn} 2j \text{Sin}\omega_c n$$
$$= \frac{\text{Sin}\omega_c n}{\pi n}$$

If, for example, we set the highest decimation as follows, the equation to calculate the discrete time $h_A$'s is below:

$$\text{Let } \omega_{c_A} = \frac{\pi}{12} \quad \text{Equation 3}$$

$$h_A(n) = \frac{\sin\frac{\pi}{12} n}{\pi n}$$

Calculating the $h_A$'s yields $$h_{A(0)} = \frac{\text{Sin}(0)}{(0)} = \frac{0}{0} \quad \text{Equation 4}$$

Using L'Hospitale's rule we get:

$$h_A(0) \approx \frac{\frac{\pi}{12} \cos\frac{\pi}{12}(0)}{\pi} \approx \frac{\pi}{12} \times \frac{1}{\pi} \approx \frac{1}{12} \quad \text{Equation 5}$$

Similarly $$h_A(1) = \frac{\sin\frac{\pi}{12}}{\pi} = \frac{\sqrt{2}}{4\pi}(\sqrt{3} - 1)$$

$$h_A(2) = \frac{\sin\frac{\pi}{6}}{2\pi} = \frac{1}{4\pi}$$

$$h_A(3) = \frac{\sin 3\frac{\pi}{12}}{3\pi} = \frac{\sqrt{2}}{6\pi}$$

$$h_A(4) = \frac{\sin\frac{\pi}{3}}{4\pi} = \frac{\sqrt{3}}{8\pi}$$

If we expand the sequence in both directions we get:

$$h_A(n) = \ldots, \frac{\sqrt{2}}{4\pi}(\sqrt{3} - 1), \frac{1}{12}, \frac{\sqrt{2}}{4\pi}(\sqrt{3} - 1), \quad \text{Equation 6}$$
$$\frac{1}{4\pi}, \frac{\sqrt{2}}{6\pi}, \frac{\sqrt{3}}{8\pi}, \frac{\sqrt{2}}{20\pi}(\sqrt{3} - 1), \frac{1}{6\pi} \ldots$$

The fifteen (15) DTFT values which form the basis for the common coefficient set is as follows:

$$h_A(0) = \frac{1}{12} \quad \text{Equation 7}$$

$$h_A(1) = \frac{\sqrt{2}}{4\pi}(\sqrt{3} - 1)$$

$$h_A(2) = \frac{1}{4\pi}$$

$$h_A(3) = \frac{\sqrt{2}}{6\pi}$$

$$h_A(4) = \frac{\sqrt{3}}{8\pi}$$

-continued $$h_A(5) = \frac{\sqrt{2}}{20\pi}(\sqrt{3} - 1)$$

$$h_A(6) = \frac{1}{6\pi}$$

$$h_A(7) = \frac{\sqrt{2}}{28\pi}(\sqrt{3} - 1)$$

$$h_A(8) = \frac{\sqrt{3}}{16\pi}$$

$$h_A(9) = \frac{\sqrt{2}}{18\pi}$$

$$h_A(10) = \frac{1}{20\pi}$$

$$h_A(11) = \frac{\sqrt{2}}{44\pi}(\sqrt{3} - 1)$$

$$h_A(12) = 0$$

$$h_A(13) = -\frac{\sqrt{2}}{52\pi}(\sqrt{3} - 1)$$

$$h_A(14) = \frac{-1}{28\pi}$$

Figure 6:
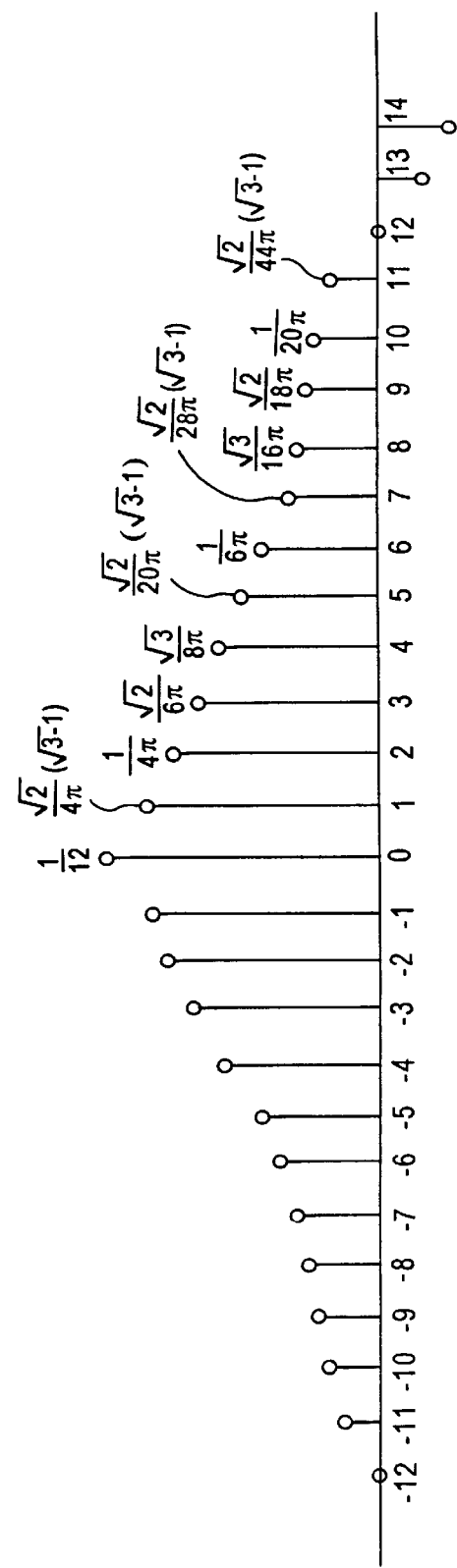
FIG. 6 is a graph of several discrete time Fourier transform (DTFT) values used for designing the exemplary digital filter frequency response characteristics shown in FIG. 5.

A graph of H(n) is shown in FIG. 6.

The dc gain is defined as the sum of all of the DTFT values.

To design a second filter having a decimation factor of $\omega_{C_B} = \frac{\pi}{6}$, we get $h(n) = \frac{\sin\left(\frac{\pi}{6}n\right)}{\pi n}$.

Solving for $h_B(0)$, we get:

$$h_B(0) = \frac{\sin(0)}{0}.$$

Using L'Hospital's Rule $$\frac{\frac{\pi}{6}\cos(0)}{\pi} \approx \frac{1}{6} \approx h_B(0).$$

We can calculate $h_B(1)$ through $h_B(7)$ similarly. Accordingly, the eight (8) coefficient value formulas needed to implement the second filter are:

$$h_B(0) = \frac{1}{6}$$ Equation 8

$$h_B(1) = \frac{1}{2\pi}$$

$$h_B(2) = \frac{\sqrt{3}}{4\pi}$$

$$h_B(3) = \frac{1}{3\pi}$$

$$h_B(4) = \frac{\sqrt{3}}{8\pi}$$

$$h_B(5) = \frac{1}{10\pi}$$

$$h_B(6) = 0$$

$$h_B(7) = \frac{-1}{14\pi}$$

It can be seen when comparing equation 7 to equation 8 that since the $h_B$ terms are all two (2) times the $h_A$ terms, that the dc gain of the second filter is twice that of the first filter. In order to correct the dc gain error of the second filter, its coefficients must be multiplied by one-half (½) so that they are equal to the first filter. An actual hardware multiplier is not needed since a multiplication by one-half (½) is the same at a binary shift.

Assuming that a third filter is to be designed having a decimation rate of $$\omega_{c_C} = \frac{3\pi}{12},$$

then $$h_c(n) = \frac{\sin\frac{3\pi}{12}n}{\pi n}$$ Equation 9

$$h_c(0) = \frac{\sin(0)}{0} = \frac{0}{0}$$

Using L'Hospital's rule:

$$h_c(0) \approx \frac{\frac{3\pi}{12}\cos(0)}{\pi} \approx \frac{3}{12}$$ Equation 10

We can similarly calculate $h_C(1)$ through $h_C(4)$.

The five (5) filter coefficient equations are given as follows:

$$h_c(0) = \frac{3}{12}$$ Equation 11

$$h_c(1) = \frac{\sqrt{2}}{2\pi}$$

$$h_c(2) = \frac{1}{2\pi}$$

$$h_c(3) = \frac{\sqrt{2}}{6\pi}$$

$$h_c(4) = 0$$

It can be seen comparing equation 11 to equation 7 that the $h_C$ terms are all three (3) times that of the $h_A$ terms. This illustrates that in the present example, the dc gain of the third filter is 3 times that of the first filter. In order to correct the dc gain error of the third filter, its coefficients must be multiplied by one-third (⅓). Since this factor, one-third (⅓), is not binary, an actual multiplier 29 would be needed.

If you compare the formulas for the values of the three (3) filters, you get:

$$h_B(0) = h_A(0) \times \frac{\omega_{CB}}{\omega_{CA}} = 2$$ Equation 12

$$h_C(0) = h_A(0) \times \frac{\omega_{CC}}{\omega_{CA}} = 3$$

-continued $$h_B(1) = h_A \left(1 \times \frac{\omega_{CB}}{\omega_{CC}}\right) \frac{\omega_{CB}}{\omega_{CA}}$$

$$h_C(1) = h_A \left(1 \times \frac{\omega_{CC}}{\omega_{CA}}\right) \frac{\omega_{CC}}{\omega_{CA}}$$

As can be seen, the following relationship exists for $h_A$, $h_B$ and $h_C$:

$$h_B(M) = h_A \left(M \times \frac{\omega_{CB}}{\omega_{CA}}\right) \frac{\omega_{CB}}{\omega_{CA}} \qquad \text{Equation 13}$$

$$h_C(M) = h_A \left(M \times \frac{\omega_{CC}}{\omega_{CA}}\right) \frac{\omega_{CC}}{\omega_{CA}}$$

The dc gain correction factor values 21 needed for filters two and three can be seen in equation 13. For the second filter, the 1/(wcb/wca) term is the factor needed to correct its dc gain. Similarly, 1/(wcc/wcb) is the factor required to correct the dc gain of the third filter. These dc gain correction factors 21 would be used in the dc gain correction processor 23 to correct the dc gain of the coefficient set values.

A set of coefficient values designed to implement the exemplary filters discussed above is shown on Table 1 below wherein Filter A is the common coefficient set, Filter B, has a passband which is twice the frequency of Filter A and is created by selecting every second coefficient of Filter A, making sure to select the center coefficient. Similarly, a third filter, Filter C, has a passband three times the frequency of filter A and can be created by selecting every third coefficient of filter A. In order to dc gain correct the exemplary filters shown in Table 1, we would need to divide the filter B coefficients by two (2) and the filter C coefficients by three (3).

Figure 7A:
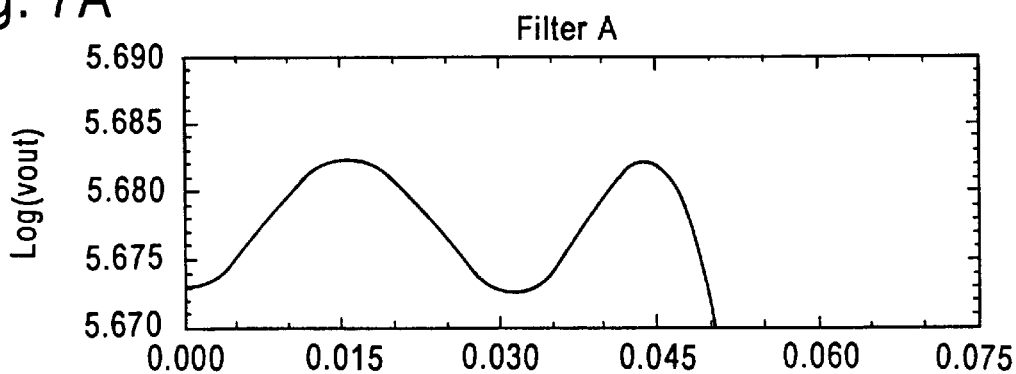
FIGS. 7A–7C are graphs illustrating passband frequency responses, and dc gains for the three exemplary filters designed and provided according the digital filter and method of the present invention.
Figure 7B:
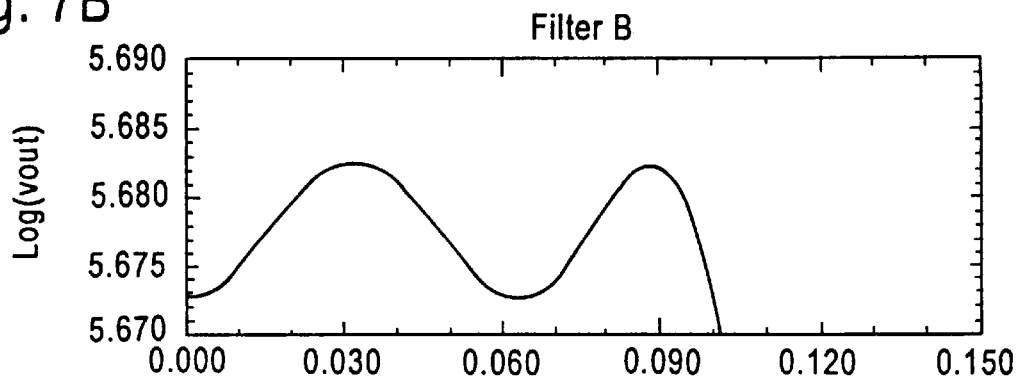
Figure 7C:
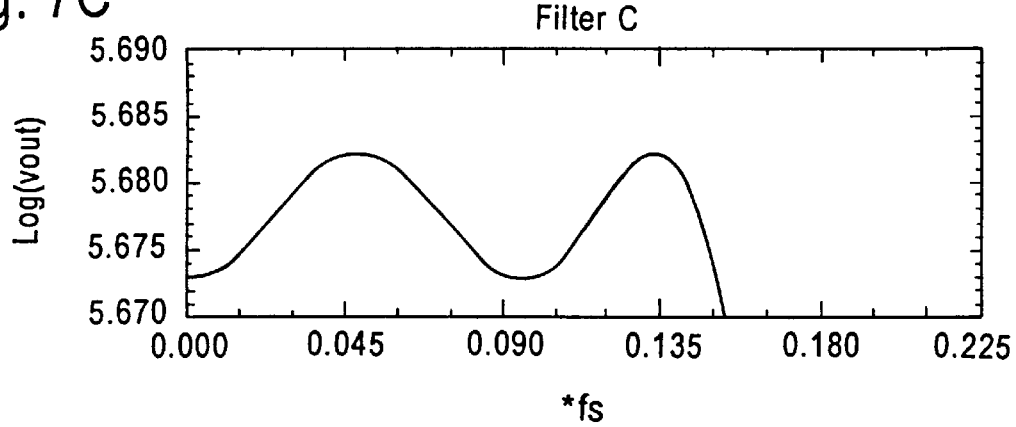

The passband frequency responses for the three designed exemplary filters are shown, for exemplary purposes, in FIGS. 7A–7C. It can be seen that the frequency responses are identical with the exception of a "two times" or "three times" shift in the cutoff frequency.

The dc gain of the three filters, which is defined as the magnitude of vout at frequency 0 is identical. It is approximately 5.67266.

The present invention, accordingly, also features a method of providing a decimated digital signal utilizing a common coefficient set and dc gain correction processor. The method begins by receiving at least one decimation control signal 110, FIG. 4. Utilizing the received decimation control signal, the method next includes providing a coefficient address signal and a digital data processor control signal, step 112.

The method next receives a coefficient value, step 114 and multiplies this coefficient value by a dc gain correction factor, step 115. If the dc gain correction factor is a binary multiple, the multiplication is simply a data shift controlled by the shifter control signal in step 112. The digital data processor receives a dc gain corrected coefficient set value, step 115, and a digital signal value, step 116, and processes the digital signal value according to the corrected coefficient value, step 118. If the digital data value is a 1, or 0, the data processor, step 118, is simply an adder or an adder function.

If another digital filter is to be implemented, a recursive series of processing steps, illustrated generally by step 120 are performed utilizing a second or subsequent coefficient set as explained herein. When all processing is complete, the method of the present invention provides a decimated digital signal value as the result, step 122.

Figure 8A:
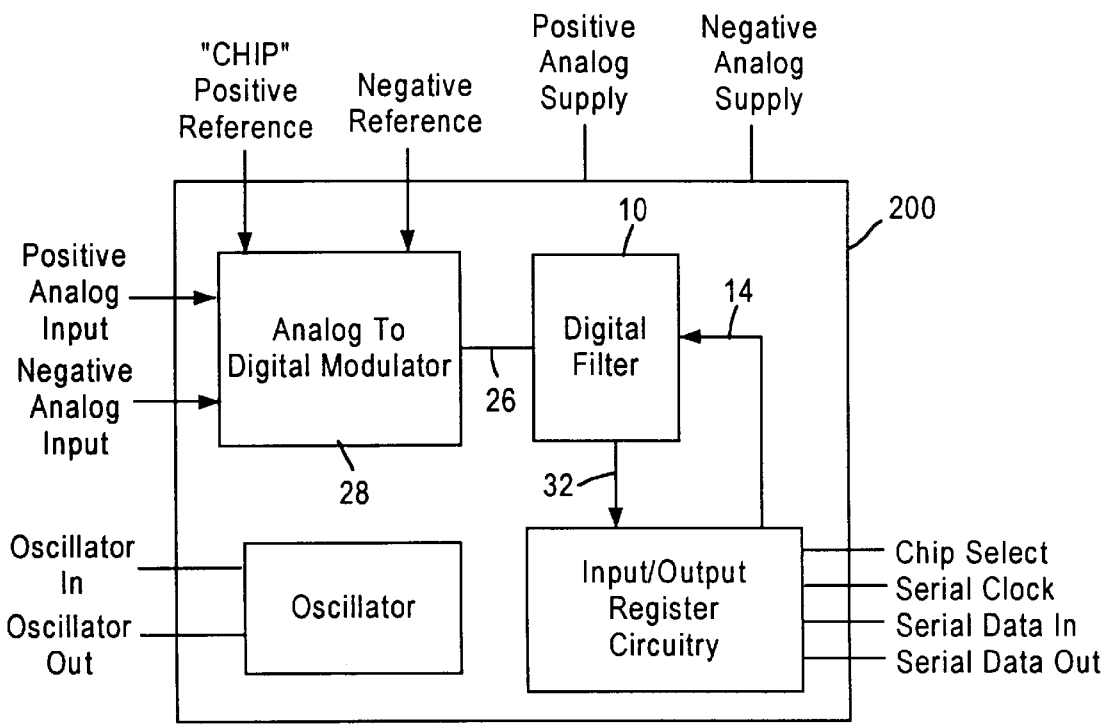
FIGS. 8A and 8B are schematic diagrams of two exemplary implementations of the filter of the present invention.
Figure 8B:
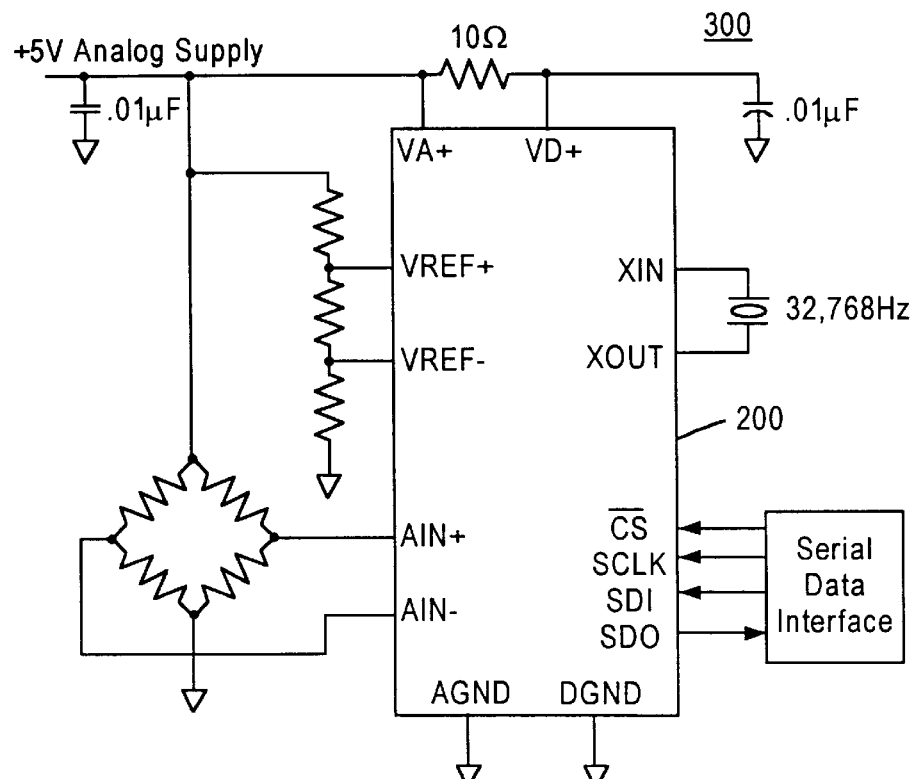

In one exemplary implementation shown in FIG. 8A, the filter according to the present invention is implemented on an integrated circuit 200. Such an integrated circuit 200 can be utilized in a bridge transducer measurement system 300, FIG. 8B.

In accordance with the invention, if accurate dc gain is required and if the various digital filters to be implemented are binary subsets of each other, subsequent corrected filter coefficients can be created by utilizing a shift register, instead of large, power consuming multiplication circuits. If a 1-bit digital data is used, the multiplication of data and coefficient really becomes an addition and no multiplier is needed.

TABLE 1

| Filter Coefficient Lists | | |
|---|---|---|
| Filter A | Filter B | Filter C |
| 17 | | 51 |
| −49 | −98 | |
| −146 | | |
| −319 | −638 | −957 |
| −567 | | |
| −870 | −1740 | |
| −1178 | | −3534 |
| −1413 | −2826 | |
| −1477 | | |
| −1275 | −2550 | −3825 |
| −739 | | |
| 138 | 276 | |
| 1284 | | 3852 |
| 2529 | 5058 | |
| 3623 | | |
| 4265 | 8530 | 12795 |
| 4164 | | |
| 3111 | 6222 | |
| 1048 | | 3144 |
| −1868 | −3736 | |
| −5247 | | |
| −8479 | −16958 | −25437 |
| −10808 | | |
| −11445 | −22890 | |
| −9704 | | −29112 |
| −5148 | −10296 | |
| 2292 | | |
| 12255 | 24510 | 36765 |
| 23949 | | |
| 36234 | 72468 | |
| 47769 | | 143307 |
| 57204 | 114408 | |
| 65536 | 131072 | 196608 |
| 63385 | | |
| 57204 | 114408 | |
| 47769 | | 143307 |
| 36234 | 72468 | |
| 23949 | | |
| 12255 | 24510 | 36765 |
| 2292 | | |
| −5148 | −10296 | |
| −9704 | | −29112 |
| −11445 | −22890 | |
| −10808 | | |
| −8479 | −16958 | −25437 |
| −5247 | | |
| −1868 | −3736 | |
| 1048 | | 3144 |
| 3111 | 6222 | |
| 4164 | | |
| 4265 | 8530 | 12795 |
| 3623 | | |
| 2529 | 5058 | |
| 1284 | | 3852 |
| 138 | 276 | |
| −739 | | |
| −1275 | −2550 | −3825 |
| −1477 | | |
| −1413 | −2826 | |
| −1178 | | −3534 |
| −870 | −1740 | |

TABLE 1-continued

| Filter Coefficient Lists | | |
|---|---|---|
| Filter A | Filter B | Filter C |
| −567 | | |
| −319 | −638 | −957 |
| −146 | | |
| −49 | −98 | |
| 17 | | 51 |

What is claimed is:

1. A dc accurate multi-rate digital filter with common coefficient set and dc gain correction processor, for receiving a digital input value and outputting a decimated digital value, the dc accurate multi-rate digital filter comprising:

a decimation controller for specifying one of a coefficient set or a subset of the coefficient set;

a storage unit connected to the decimation controller, and containing a digital filter coefficient set, the storage unit providing at least one addressable digital filter coefficient value from said coefficient set;

a dc gain correction processor connected to the storage unit, for providing at least one corrected digital filter coefficient value responsive to a coefficient value from the set or subset selected by the decimation controller, and a digital data processor for receiving said input value and said at least one corrected digital filter coefficient value to produce an output.

2. The filter of claim 1 in which said digital data processor produces a dc gain corrected decimated data output.

3. The filter of claim 1, further including an analog to digital converter, for receiving at least one analog input signal and for providing a digital input value.

4. The filter of claim 3, wherein said analog to digital converter includes a delta-sigma modulator.

5. The filter of claim 3 wherein said at least one analog input signal is provided from a bridge measurement device, for providing a bridge measurement system.

6. The filter of claim 1, wherein a plurality of addressable digital filter coefficient values of said common digital filter coefficient set are derived from a highest digital signal decimation to be provided by the filter.

7. The filter of claim 1, wherein said dc gain correction processor processes the value of at least one digital filter coefficient value in accordance with a predetermined dc gain correction factor and outputs said at least one corrected digital filter coefficient value.

8. The filter of claim 7, wherein said at least one digital filter coefficient value is a subset of said digital filter coefficient set.

9. The filter of claim 8, wherein said subset is a binary subset of a plurality of addressable digital filter coefficient values of said at least one common digital filter coefficient set.

10. The filter of claim 8, wherein said dc gain correction processor includes a data shifter, for performing binary multiplication of said plurality of individually addressable digital filter coefficient values by shifting.

11. The filter of claim 1, in which said digital data processor processes said digital input value and outputs a decimated digital value responsive to at least one corrected coefficient value.

12. A method of providing a decimated digital signal comprising:

receiving at least one decimation rate control input;

providing at least one common coefficient set address, at least one corrected coefficient value and at least one digital data processor control value in response to said at least one received decimation rate control input;

receiving at least one digital value;

receiving at least one coefficient value;

processing at least one common digital filter coefficient responsive to said dc gain correction factor to provide at least one corrected coefficient value; and processing said at least one received digital value and said at least one corrected coefficient value responsive to said digital data processor control value, to provide a decimated digital value.

13. The method of claim 12 wherein said step of processing said at least one received digital valuel and said at least one corrected coefficient value includes processing said at least one received digital value according to a first digital coefficient value set and to at least a second digital signal coefficient value set.

14. The method of claim 13 wherein said second digital signal coefficient value set is a binary subset of at least one coefficient value of said first digital signal coefficient value set.

15. The method of claim 13 wherein said processing of said at least one corrected coefficient value includes predetermining a unique dc gain correction factor for each digital coefficient value set or subset.

16. The method of claim 12 further including before the step of receiving at least one decimation rate control input the steps of:

determining a frequency response range desired by a digital filter;

determining said highest filter decimation to be performed by said digital filter;

computing at least one filter coefficient set in response to said step of determining said highest digital filter decimation and said lowest digital filter frequency response; and computing at least one dc gain correction factor in response to said step of determining said highest and said lowest digital filter frequency response.

* * * * *